United States Patent
Tang et al.

(10) Patent No.: US 9,328,413 B2
(45) Date of Patent: May 3, 2016

(54) METHOD FOR PREPARING GRAPHENE NANORIBBON ON INSULATING SUBSTRATE

(75) Inventors: Shujie Tang, Shanghai (CN); Guqiao Ding, Shanghai (CN); Xiaoming Xie, Shanghai (CN); Ji Chen, Shanghai (CN); Chen Wang, Shanghai (CN); Mianheng Jiang, Shanghai (CN)

(73) Assignee: SHANGHAI INSTITUTE OF MICROSYSTEM AND INFORMATION TECHNOLOGY, CHINESE ACADEMY OF SCIENCES, Changning District, Shanghai (CN)

( * ) Notice: Subject to any disclaimer, the term of this patent is extended or adjusted under 35 U.S.C. 154(b) by 803 days.

(21) Appl. No.: 13/580,240

(22) PCT Filed: Aug. 5, 2011

(86) PCT No.: PCT/CN2011/078070
§ 371 (c)(1),
(2), (4) Date: Aug. 21, 2012

(87) PCT Pub. No.: WO2013/013419
PCT Pub. Date: Jan. 31, 2013

(65) Prior Publication Data
US 2013/0022813 A1    Jan. 24, 2013

(30) Foreign Application Priority Data

Jul. 22, 2011 (CN) .......................... 2011 1 0206608

(51) Int. Cl.
| | |
|---|---|
| *C23C 16/26* | (2006.01) |
| *B05D 3/00* | (2006.01) |
| *C23C 16/02* | (2006.01) |
| *B82Y 30/00* | (2011.01) |
| *B82Y 40/00* | (2011.01) |
| *C01B 31/04* | (2006.01) |

(52) U.S. Cl.
CPC ............ *C23C 16/0218* (2013.01); *B82Y 30/00* (2013.01); *B82Y 40/00* (2013.01); *C01B 31/0446* (2013.01); *C01B 31/0453* (2013.01); *C23C 16/0272* (2013.01); *C23C 16/26* (2013.01); *C01B 2204/06* (2013.01); *Y10T 428/2918* (2015.01)

(58) Field of Classification Search
CPC .................................. C23C 16/26; B05D 3/00
See application file for complete search history.

(56) References Cited

U.S. PATENT DOCUMENTS

| | | | |
|---|---|---|---|
| 9,061,912 B2 * | 6/2015 | Zhang | |
| 2010/0021708 A1 * | 1/2010 | Kong et al. | 428/220 |
| 2015/0225244 A1 * | 8/2015 | Hintermann | B82Y 30/00 423/448 |

OTHER PUBLICATIONS

Kan, Erjun, et al., "Graphene Nanoribbons: Geometric, Electronic, and Magnetic Properties." Physics and Applications of Graphene—Theory, edited by Dr. Sergey Mikhailov, InTech, Mar. 22, 2011, pp. 331-349.*
Terrones, Mauricio, et al., "Graphene and graphite nanoribbons: Morphology, properties, synthesis, defects and applications." NanoToday (2010) 5, 351-372.*
Jacobberger, Robert M., et al., "Direct oriented growth of armchair graphene nanoribbons on germanium". Nature Communications, 6:8006, DOI: 10,1038/ncomms9006, Aug. 10, 2015, pp. 1-8.*

* cited by examiner

*Primary Examiner* — Bret Chen
(74) *Attorney, Agent, or Firm* — Global IP Services; Tianhua Gu (57) ABSTRACT

A method for growing a graphene nanoribbon on an insulating substrate having a cleavage plane with atomic level flatness is provided, and belongs to the field of low-dimensional materials and new materials. The method includes the following steps. Step 1: Cleave an insulating substrate to obtain a cleavage plane with atomic level flatness, and prepare a single atomic layer step. Step 2: Directly grow a graphene nanoribbon on the insulating substrate having regular single atomic steps. In the method, a characteristic that nucleation energy of graphene on the atomic step is different from that on the flat cleavage plane is used, and conditions, such as the temperature, intensity of pressure and supersaturation degree of activated carbon atoms, are adjusted, so that the graphene grows only along a step edge into a graphene nanoribbon of an adjustable size. The method is mainly applied to the field of new-type graphene optoelectronic devices.

11 Claims, 5 Drawing Sheets

METHOD FOR PREPARING GRAPHENE NANORIBBON ON INSULATING SUBSTRATE

CROSS REFERENCE TO RELATED PATENT APPLICATION

The present application is the US national stage of PCT/CN2011/078070 filed on Aug. 5, 2011, which claims the priority of the Chinese patent application No. 201110206608.6 filed on Jul. 22, 2011, which application is incorporated herein by reference.

BACKGROUND OF THE PRESENT INVENTION

1. Field of Invention

The present invention relates to a method for preparing a graphene nanoribbon on an insulating substrate, and specifically to a method for growing a graphene nanoribbon using an insulating substrate having steps of the thickness of a single atomic layer as a template. The present invention belongs to the field of low-dimensional materials and new materials.

2. Description of Related Arts

As is restricted by a physical principle, a machining limit for a silicon material is generally considered as a line width of 10 nm. When the width is smaller than 10 nm, it is unlikely to produce a product of stable performance and high integration. To find a material for replacing silicon as a channel layer of a next-generation optoelectronic device becomes a top priority to extend Moore's law and obtain a chip of higher performance. After being discovered in 2004, graphene shows tremendous application potential in fields such as next-generation optoelectronic devices, transparent conductive films and sensors, because of its unique properties including the properties of being the thinnest and the firmest, and having high thermal conductivity, high rigidity, high electron mobility, zero effective mass, capability of being transported on a ballistic trajectory at a room temperature, and a withstand current density higher than that of copper by 6 orders of magnitude. Especially, the electron mobility of the graphene exceeds 15,000 $cm^2/Vs$ at a normal temperature, so that the graphene is expected to replace silicon for developing a new-generation electronic component or optoelectronic device which is thinner and has a higher conduction speed. Currently developed conventional methods for preparing graphene include: micromechanical stripping, pyrolysis of silicon carbide (SiC), chemical vapor deposition (CVD) on a transition metal and a heavy metal, and chemical intercalation redox. Methods suitable for preparing a graphene optoelectronic device include: SiC pyrolysis and CVD on a transition metal. The temperature required for the SiC pyrolysis is too high, which is not compatible with a current semiconductor technology, and the cost of a SiC substrate is also high. In the application of a new-type electronic device, preparation of graphene by the CVD is compatible with the current semiconductor technology, and the cost is low.

However, currently, when preparing graphene on a transition metal, the prepared graphene needs to be transferred onto an insulating substrate. A wet chemical process is used in the transfer process, and a defect is unavoidably introduced, which greatly lowers the electron mobility of the graphene. Besides, most insulating layers of currently studied graphene optoelectronic devices are $SiO_2/Si$. A $SiO_2/Si$ substrate is not a suitable or first-choice substrate for a graphene electronic device. An article "Intrinsic and Extrinsic Performance Limits of Graphene Devices on $SiO_2$" published by J. H. Chen, et al. in Nature Nanotechnology in 2008 points out that, because of localized carrier doping of graphene caused by charge gathering on a $SiO_2$ surface and a scattering effect of a phonon on graphene carriers at a $SiO_2$-graphene interface, an upper limit of the electron mobility of the graphene is reduced to 40,000 $cm^2/Vs$, which greatly reduces the application of the graphene.

How to avoid the transfer of the graphene and overcome the deficiency of the $SiO_2/Si$ substrate is critical to a graphene optoelectronic device. Hexagonal boron nitride (hBN) is an insulating substrate used for preparing graphene with highest potential. The hBN is an isoelectronic species of graphene, and has the same layered structure as the graphene. The hBN has no dangling bond on a (0001) surface, and a lattice mismatching rate with the graphene is only 1.7%. Currently, a plurality of articles, such as an article "Local Electronic Properties of Graphene on a BN Substrate via Scanning Tunneling Microscopy" published by R. G. Decker, et al. in Nano Letter and an article "Boron nitride substrates for high-quality graphene electronics" published by Dean, C. R., et al. in Nature Nanotechnology, reports that graphene is mechanically transferred onto an hBN substrate, and the hBN substrate is also implemented by mechanically stripping an hBN bulk. Experimental results indicate that the electron mobility is increased by an order of magnitude than that on the $SiO_2$. Similar to the hBN, gallium nitride, aluminum oxide, strontium titanate and quartz which have a cleavage plane with atomic level flatness may all become ideal substrates for maintaining the high mobility of the graphene.

Except that the hBN substrate is superior to the $SiO_2/Si$ substrate for the transferred graphene, a report indicates that high-quality graphene is expected to directly grow on the hBN, which avoids a currently widely used transfer technological process. An article "Direct growth of few layer graphene on hexagonal boron nitride by chemical vapor deposition" published by our research team in Carbon in 2011 reports a method for preparing graphene by the CVD using the hBN as a substrate, which implements direct growth of the graphene on the hBN. However, the graphene prepared by this method completely coats the hBN substrate, and meanwhile, the controllability of the thickness is not sufficient, making it difficult to implement uniform single-layered and double-layered graphene. An article "Direct graphene growth on insulator" written by G. Lippert, et al. puts forward a method for growing graphene on a mica surface by an MBE method, but the obtained graphene is of poor quality. Currently, direct growth of the graphene on the hBN is far from meeting the requirement for preparing a chip.

A graphene nanoribbon, as a structure of graphene, destroys translational symmetry of the graphene, and opens a band gap of the graphene, which is an important breakthrough in the application of a graphene electronic device. An article "Etching and narrowing of graphene from the edges" published in Nature Chemistry in 2010 reports that the width of graphene is reduced to less than 5 nm by using chemical vapor etching and an on/off ratio up to $10^4$ is obtained at the room temperature. Currently, main methods for preparing a graphene nanoribbon include cutting open a carbon nanotube by a chemical method put forward in US20100105834A1 (Methods for Preparation of Graphene Nanoribbons from Carbon Nanotubes and Compositions, Thin Films and Devices Derived Therefrom). This method introduces a defect into a process of preparing a graphene nanoribbon, and has great influence on the electron mobility of graphene. US20090226361A1 (CVD-Grown Graphite Nanoribbon), US20100047154A1 (Method for Preparing Graphene Ribbons) and US20110097258A1 (Method For Preparing Graphene Ribbons Where Structore is Controlled) put forward a method for preparing, by the CVD, substrate-free graphene nanoribbon precursors—a helical graphene nanoribbon and disorderly stacked graphite ribbons, in which energy is applied to disperse the helical graphene nanoribbon and the disorderly stacked graphite ribbons into monodispersed graphene nanoribbons. The feature size and thickness of the graphene nanoribbons prepared by the two methods are in a certain range, and are difficult to be precisely controlled. When applied as an electronic material, the graphene needs to be transferred onto a suitable substrate. U.S. Pat. No. 7,887,888B1 (Methods and Systems for Farbrication of Graphene Nanoribbon) puts forward a method for evaporating a metal nanoribbon on graphite and preparing a graphene nanoribbon by using an electrostatic deposition method. Deposition of metal destroys a lattice structure of graphene, and is influenced in size by a limit of the metal nanoribbon. Meanwhile, the graphene nanoribbon has metal residue thereon. Currently, it is not implemented that the CVD or another deposition means is directly used to grow a high-quality graphene nanoribbon on an insulating substrate which meets a microelectronic requirement.

As can be seen from the above, the hBN substrate may maintain the high mobility of the graphene. With direct preparation of the graphene on the hBN substrate and a similar insulator having a cleavage plane with atomic level flatness and tailoring of the size of the graphene, a controllable graphene nanoribbon is implemented, and a band gap thereof is opened, which sets an important basis for obtaining a graphene optoelectronic device of high performance.

SUMMARY OF THE PRESENT INVENTION

To solve the deficiency in direct growth of graphene on an hBN substrate and another substrate having a cleavage plane with atomic level flatness and the deficiency that a graphene nanoribbon cannot be directly prepared in the prior art, the present invention puts forward a method for controllably preparing a high-quality graphene nanoribbon in a step-flow mode on an insulating substrate having atomic layer steps, so as to meet the requirements for preparing a transistor or other graphene optoelectronic devices in microelectronics.

The present invention is implemented according to the following technical solution. Step 1: Prepare a single atomic layer step on an insulating substrate. Step 2: Grow a graphene nanoribbon in a step-flow mode on the insulating substrate by using methods, such as low-pressure chemical vapor deposition (LPCVD), plasma-enhanced chemical vapor deposition (PECVD) and pulsed laser deposition (PLD).

The present invention adopts the following technical solution.

A method for preparing a graphene nanoribbon on an insulating substrate is provided, which comprises:

1) preparing a single atomic layer step on an insulating substrate; and 2) directly growing a graphene nanoribbon on the insulating substrate having single atomic layer steps obtained in Step 1).

The single atomic layer steps are steps, where the height of a single step is the thickness of one atomic layer; or grooves, the depth of which is the thickness of one atomic layer. Preferably, the width of the step is from 50 nm to 20 μm, and an optimal step spacing is from 500 nm to 5 μm; while the width of the groove is from 1 nm to 500 nm.

The insulating substrate refers to a substrate material capable of being dissociated to form a cleavage plane with atomic level flatness, and is selected from materials, such as hBN, gallium nitride, strontium titanate, aluminum oxide and quartz.

In Step 1), for different insulating substrates, methods for preparing a single atomic layer step are different. For example, preparation of a single atomic layer step on an hBN substrate is implemented by annealing the hBN in a mixture of hydrogen gas and argon gas; preparation of a single atomic layer step on a strontium titanate substrate is implemented by a chemical directional etching method provided by an article "ATOMIC CONTROL OF THE $SRTIO_3$ CRYSTAL-SURFACE" published by KAWASAKI, M, et al. in Science in 1994; and preparation of a single atomic layer step on a quartz or gallium nitride substrate is implemented by performing plasma etching on quartz or gallium nitride. Preparation of a single atomic layer step on an aluminum oxide substrate is implemented by a bevel high-temperature processing method mentioned in an article "About anisotropy of atomic-scale height step on (0001) sapphire surface" published by O. Kurnosikov, et al. in Surface Science.

Further, the preparation of the single atomic layer step on the hBN substrate comprises: cleaving a surface of the hBN substrate to obtain a fresh atomic surface; and placing the hBN substrate in a mixture of hydrogen gas and argon gas for an annealing treatment, to obtain an hBN substrate having single atomic layer steps.

The hBN substrate comprises, but is not limited to, a monocrystal hBN bulk, a monocrystal hBN flake obtained by using a mechanical stripping method, and an hBN substrate prepared by using a CVD method.

Cleavage of the hBN substrate is to remove a top layer of hBN by a mechanical stripping method, and meanwhile, surface adsorbates and defects, such as a surface mechanical scratch, are eliminated, so that a fresh hBN atomic surface is exposed with few surface defects.

Preferably, in the mixture of the hydrogen gas and the argon gas, a volume ratio of the hydrogen gas and the argon gas is from 1:1 to 1:10, and preferably from 1:2 to 1:9. An annealing temperature of the high-temperature annealing treatment is from 1,000° C. to 1,200° C., and an annealing time thereof is from 10 min to 300 min. The annealing temperature may regulate and control an etching rate, and the annealing time may regulate and control distribution of the single atomic steps.

In Step 2), the method of LPCVD, PECVD or PLD is used to grow the graphene nanoribbon in a step-flow mode on the insulating substrate having single atomic layer steps. The growth of the graphene in the step-flow mode means a growth mode that atoms are ceaselessly absorbed at each step edge and the steps continuously progress forward.

In Step 2), a carbon source required for the growth of the graphene nanoribbon is selected from a gaseous carbon source, a liquid carbon source and a solid carbon source. The gaseous carbon source is selected from gases, such as methane, ethylene and ethyne. The liquid carbon source is selected from liquids, such as benzene. The solid carbon source is selected from solids, such as polymethylmethacrylate (PMMA), glucose, and graphite. According to different carbon sources and insulating substrates, the method of LPCVD, PECVD or PLD is selected to prepare the graphene nanoribbon.

In Step 2), a growth temperature for the graphene nanoribbon is from 500° C. to 1,300° C. According to different widths of the graphene nanoribbons required to be obtained, a temperature ranging from 900° C. to 1,200° C. is preferred. A growth time for the graphene nanoribbon is from 5 min to 5 h, and preferably from 20 min to 3 h.

In Step 2), when directly growing the graphene nanoribbon on the insulating substrate having single atomic layer steps, any one of the deposition methods (for example, the PLD, the CVD, and the PECVD) may be adopted to directly grow the graphene nanoribbon on the used insulating substrate (for example, the boron nitride, the gallium nitride, the aluminum oxide, and the strontium titanate). As exemplary solutions, the present invention lists herein the following three exemplary implementations.

When the substrate is the hBN or the gallium nitride, in Step 2), the method of LPCVD is adopted to grow the graphene nanoribbon, which specifically comprises: in an Ar atmosphere, maintaining the temperature of the hBN substrate having single atomic steps at 900 to 1,200° C. for 5 to 15 min; feeding therein a gaseous carbon source, and meanwhile, maintaining the intensity of pressure at 1 to 5 Pa, allowing to grow for 60 to 180 min, and when the growth is finished, cutting off the supply of the gaseous carbon source, continuing to feed Ar as a protective gas therein, and allowing to cool down naturally. Preferably, the gaseous carbon source is selected from gases, such as methane, ethylene and ethyne.

When the substrate is a strontium titanate substrate, the method of PLD is adopted to grow the graphene nanoribbon, which specifically comprises: loading a prepared strontium titanate substrate having single atomic steps into a PLD growth chamber, using a solid carbon source target as a growth carbon source, and maintaining a growth pressure from $10^{-5}$ to $10^{-4}$ Pa, a laser frequency from 1 to 10 Hz, a substrate temperature from 600 to 850° C., a target-substrate distance from 50 to 70 cm, and the number of laser pulses from 10 to 500. Preferably, the solid carbon source is selected from solids, such as PMMA, glucose, and graphite.

When the substrate is an aluminum oxide substrate, the method of PECVD is adopted to grow the graphene nanoribbon, which specifically comprises: putting an etched aluminum oxide substrate having single atomic steps into a PECVD growth tube furnace, and maintaining a temperature at 850 to 950° C. for 5 to 15 min in an Ar atmosphere; feeding a mixture of $C_2H_2$ and $H_2$ into the tube furnace, and meanwhile, maintaining the intensity of pressure at 100 to 500 Pa, allowing to grow for 60 to 180 min, and when the growth is finished, cutting off the supply of the mixture of $C_2H_2$ and $H_2$, continuing to feed Ar as a protective gas into the tube furnace, and allowing to cool down naturally. Preferably, a volume ratio of $C_2H_2$ and $H_2$ is from 1:1 to 1:5.

The present invention also further discloses a graphene nanoribbon obtained by the above methods. For the graphene nanoribbon obtained by the above methods provided by the present invention, the feature width thereof is from 1 nm to 500 nm. The feature length thereof is relevant to the length of an atomic layer step on the insulating substrate, and the length of an obtained typical nanoribbon is from 100 nm to 100 μm.

In the present invention, the substrate having steps of the thickness of a single atomic layer is used as a base to control a graphene deposition technology and grow the graphene nanoribbon in a step-flow mode. In a growth and nucleation process of the graphene, nucleation energy required for the nucleation on a defect portion, especially, a portion below the step is smaller than that on the plane, so that the single atomic step on the insulating substrate can become a nucleation zone for the growth of the graphene. By using a difference between nucleation energy at a step edge and that on the plane, and by controlling the temperature, the intensity of pressure and the supersaturation degree of activated carbon atoms in the growth process, the nucleation may be controlled to only occur at the atomic step, thereby achieving the effect of growing a graphene nanoribbon.

In the present invention, preparation technologies compatible with a semiconductor technology, such as the LPCVD, the PECVD, and the PLD are used for implementing the graphene nanoribbon on the insulating substrate, which avoids the transfer of the graphene, and the substrate with atomic level flatness ensures the performance of the prepared graphene. The prepared graphene nanoribbon may be directly used to prepare a graphene electronic device.

DETAILED DESCRIPTION OF THE PREFERRED EMBODIMENTS

The essential characteristics and remarkable progresses of the present invention are further illustrated with specific description of embodiments in the following, but the present invention is not merely limited to the embodiments.

Embodiment 1

Preparation of an hBN Substrate Having Single Atomic Layer Steps

Figure 1:
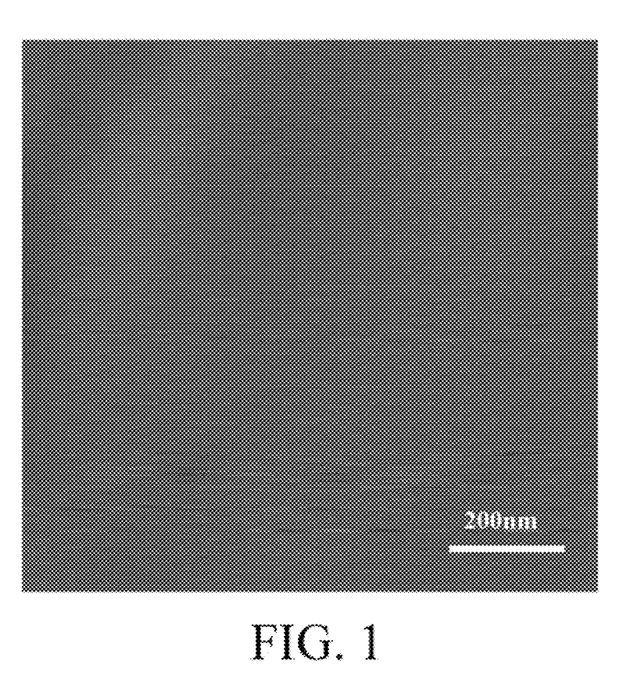
FIG. 1 is an atomic force microscope image of mechanically stripped hBN in Embodiment 1.

Step 1: Use a monocrystal hBN flake as a raw material, and mechanically strip the monocrystal hBN flake on a $SiO_2$/Si substrate to obtain an hBN sheet having a fresh cleavage plane, and as shown in FIG. 1, a surface thereof is highly flat without any step.

Figure 2:
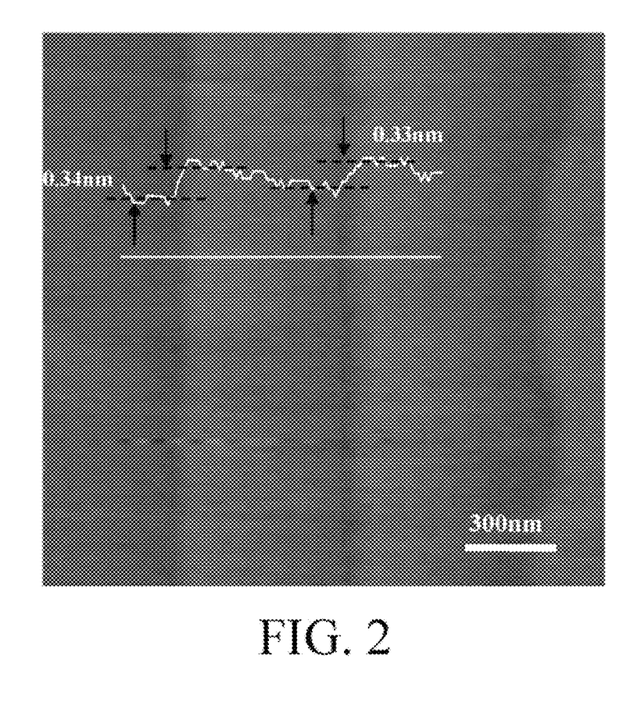
FIG. 2 is an atomic force microscope image of single atomic layer steps of etched hBN in Embodiment 1.

Step 2: Put an hBN/$SiO_2$ substrate obtained in Step 1 into a tube furnace, feed therein 300 sccm of a mixture of hydrogen gas and argon gas (a volume ratio thereof is $H_2$:Ar=1:3), heat the temperature up to 1,200° C. at a rate of 20° C./min, maintain the temperature unchanged for 10 min, and allow to cool down with the tube furnace. In this way, steps having the height of a single atomic layer as shown in FIG. 2 are obtained. As is shown by a height analysis, height differences of the steps are 0.34 nm and 0.33 nm, the steps are steps of a single BN atomic layer, and a spacing between the steps is about 500 nm.

Embodiment 2

Preparation of an hBN Substrate Having Single Atomic Layer Steps

Step 1: Use a monocrystal hBN bulk as a substrate, and remove a surface layer of hBN by using a mechanical stripping method.

Figure 3:
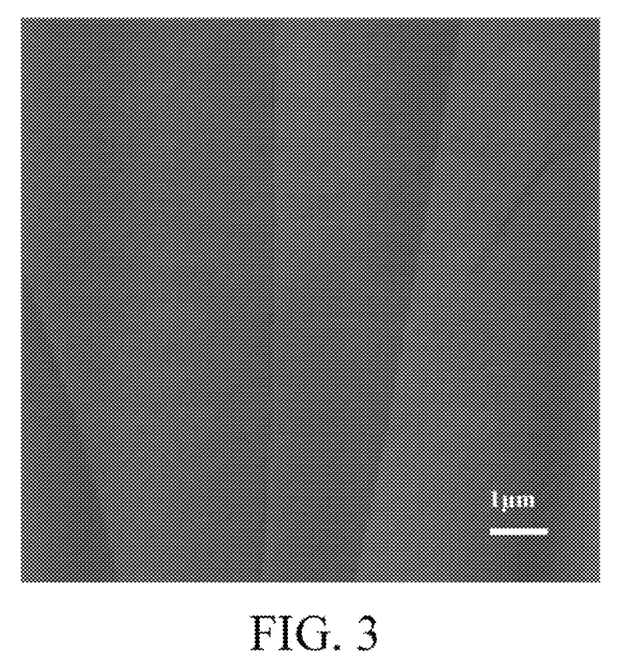
FIG. 3 is an atomic force microscope image of a surface of etched hBN in Embodiment 2.

Step 2: Put the substrate into a tube furnace, feed therein 300 sccm of a mixture of hydrogen gas and argon gas (a volume ratio thereof is $H_2$:Ar=1:6), heat the temperature up to 1,100° C. at a rate of 20° C./min, maintain the temperature unchanged for 50 min, and allow to cool down with the tube furnace. In this way, as shown in FIG. 3, steps having the height of a single atomic layer are obtained. A spacing between the steps is from 1 to 5 μm.

Embodiment 3

Preparation of an hBN Substrate Having Single Atomic Layer Steps

Step 1: Use hBN grown by a CVD method as a substrate, and remove a surface layer of hBN by using a mechanical stripping method. A process of preparing hBN by a CVD method includes: using borazine as a BN source, using argon gas as a carrier gas, using metal Ni as a substrate at 1,000° C., allowing the grow at a pressure of 5 Pa for half an hour to obtain an hBN film, and transferring the hBN film onto a $SiO_2$/Si substrate.

Figure 4:
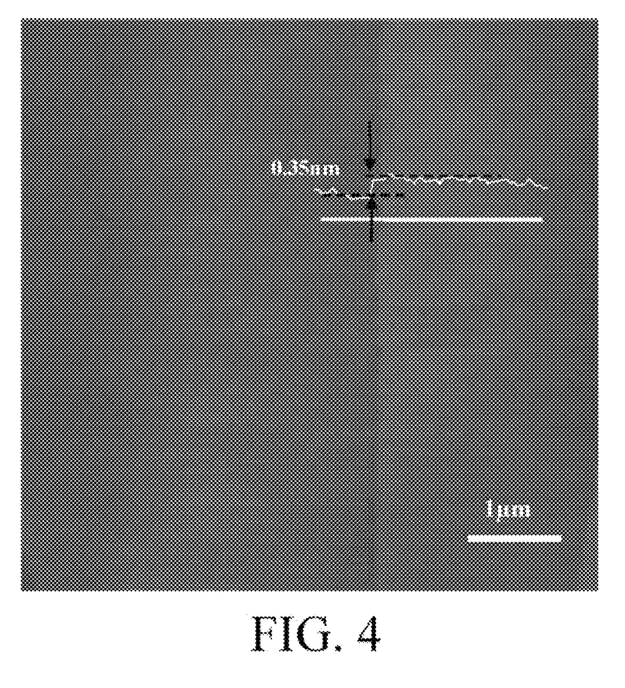
FIG. 4 is an atomic force microscope image of a surface of etched hBN in Embodiment 3.
Figure 5:
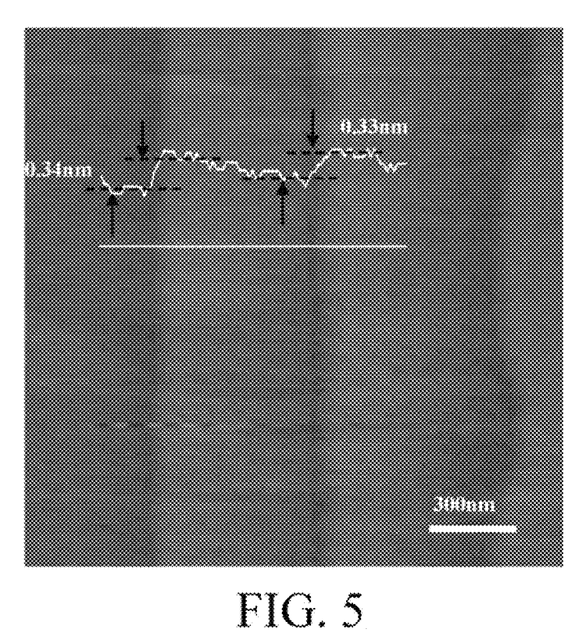
FIG. 5 is an atomic force microscope image of hBN having single atomic layer steps after being etched in Embodiment 4.

Step 2: Put the substrate into a tube furnace, feed therein 300 sccm of a mixture of hydrogen gas and argon gas (a volume ratio thereof is $H_2$:Ar=1:9), heat the temperature up to 1,000° C. at a rate of 20° C./min, maintain the temperature unchanged for 300 min, and finally allow to cool down with the tube furnace. In this way, as shown in FIG. 4, steps having the height of a single atomic layer are obtained. A height analysis result of the steps is 0.35 nm, the steps are single BN atomic steps, and a spacing between the steps is 2 to 5 μm.

Embodiment 4

Preparation of a Graphene Nanoribbon Having a Width of 200 nm Using hBN as a Substrate Step 1: Use monocrystal hBN as a raw material, and mechanically strip the monocrystal hBN on a $SiO_2$/Si substrate to obtain an hBN sheet having a fresh cleavage plane.

Step 2: Put an hBN/$SiO_2$ substrate obtained in Step 1 into a tube furnace, feed therein 300 sccm of a mixture of hydrogen gas and argon gas (a volume ratio thereof is $H_2$:Ar=1:2), heat the temperature up to 1,200° C. at a rate of 20° C./min, maintain the temperature unchanged for 10 min, and finally allow to cool down with the tube furnace. In this way, steps having the height of a single atomic layer as shown in FIG. 1 are obtained.

Step 3: In an Ar atmosphere, heat the temperature of the hBN/$SiO_2$ substrate having atomic steps up to 1,200° C. at a rate of 10° C./min, maintain the temperature unchanged for 10 min, feed $CH_4$ gas into the tube furnace at a speed of 5 sccm, and meanwhile, maintain the intensity of pressure at 4.1 Pa by using a vacuum pump, allow to grow for 180 min, and when the growth is finished, cut off the supply of the $CH_4$ gas, feed Ar as a protective gas into the tube furnace, and allow to cool down naturally.

Figure 6:
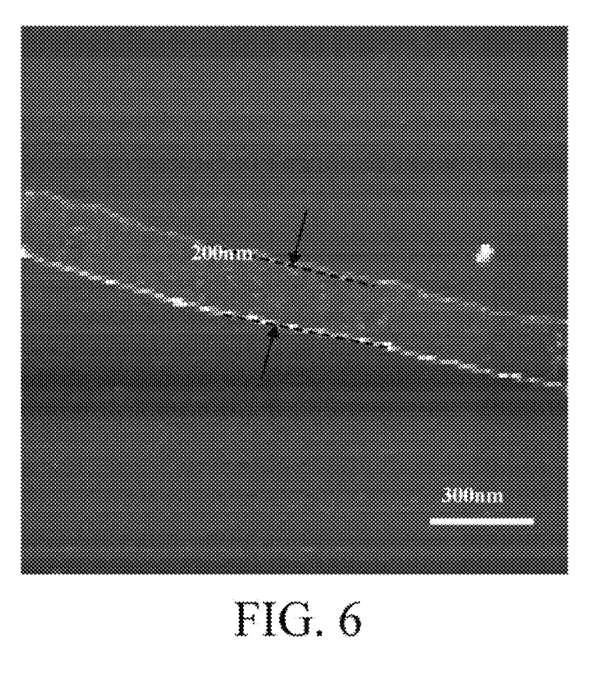
FIG. 6 is an atomic force microscope image of a graphene nanoribbon along a lower edge of a step on hBN in Embodiment 4.
Figure 7:
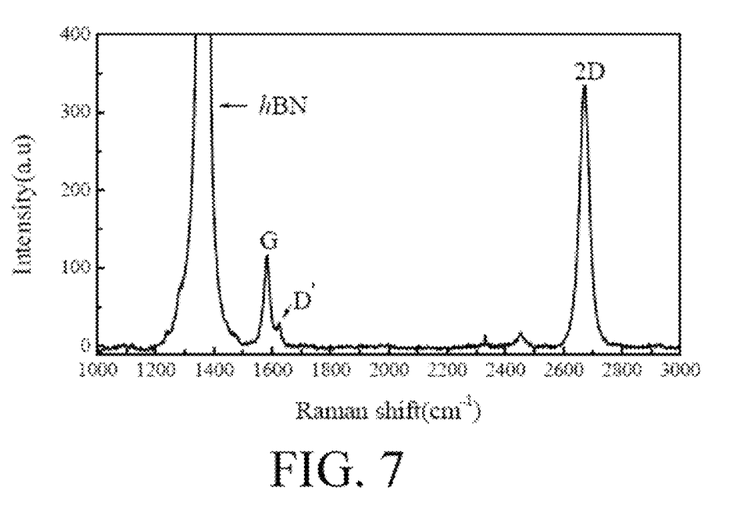
FIG. 7 is a Raman spectrum of a graphene nanoribbon in Embodiment 4.

With the above technology, a graphene nanoribbon having a width of 200 nm is grown. An atomic force microscope image in FIG. 6 and a Raman spectrum in FIG. 7 indicate that the width of the graphene nanoribbon is 200 nm and the number of graphene layers is one atomic layer.

Embodiment 5

Preparation of a Graphene Nanoribbon Having a Width of 40 nm Using hBN as a Substrate Step 1: Use monocrystal hBN as a substrate.

Step 2: Put the substrate into a tube furnace, feed therein 300 sccm of a mixture of hydrogen gas and argon gas ($H_2$:Ar=1:2), heat the temperature up to 1,200° C. at a rate of 20° C./min, maintain the temperature unchanged for 10 min, and finally allow to cool down with the tube furnace. In this way, steps having the height of a single atomic layer are obtained.

Step 3: Put the hBN etched by using high-temperature hydrogen gas into a CVD growth tube furnace. In an Ar atmosphere, heat the temperature up to 1,150° C. at a rate of 10° C./min, maintain the temperature unchanged for 10 min, feed $C_2H_2$ gas into the tube furnace at a speed of 1 sccm, and meanwhile, maintain the intensity of pressure at 1.2 Pa by using a vacuum pump, allow to grow for 60 min, and when the growth is finished, cut off the supply of the $C_2H_2$ gas, feed Ar as a protective gas into the tube furnace, and allow to cool down naturally.

Figure 8:
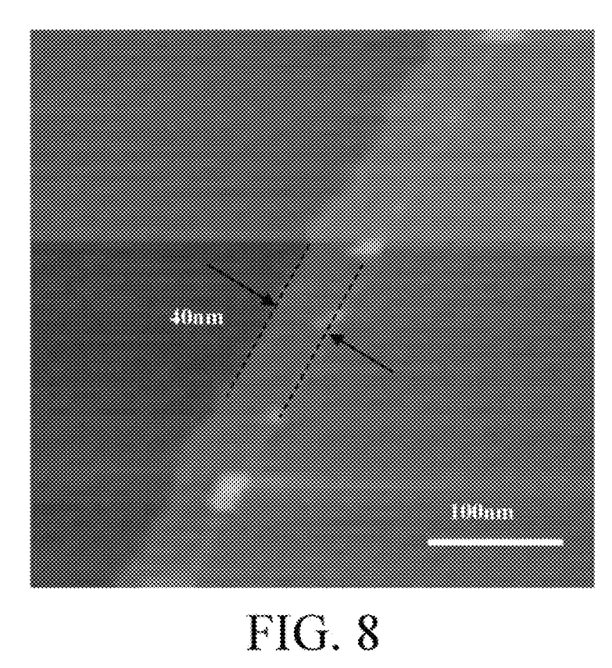
FIG. 8 is an atomic force microscope image of a graphene nanoribbon along a lower edge of a step on hBN in Embodiment 5.
Figure 9:
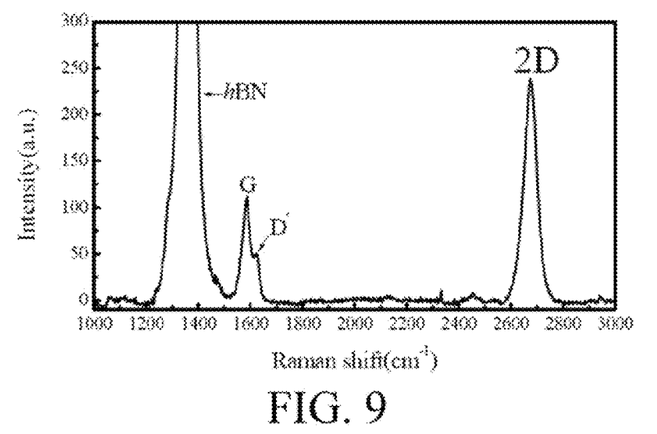
FIG. 9 is a Raman spectrum of a graphene nanoribbon in Embodiment 5.

With the above technology, a graphene nanoribbon having a width of 40 nm is grown. An atomic force microscope image in FIG. 8 and a Raman spectrum in FIG. 9 show that the width of the nanoribbon is 40 nm, and the thickness of the graphene is one layer.

Embodiment 6

Preparation of a Graphene Nanoribbon Having a Width of 40 nm Using Gallium Nitride as a Substrate Step 1: Use gallium nitride as a substrate, and prepare grooves having the thickness of a single atomic layer by using a plasma etching method. The width of the groove is from 1 nm to 500 nm.

Step 2: Put the etched gallium nitride substrate into a CVD growth tube furnace. In an Ar atmosphere, heat the temperature up to 900° C. at a rate of 10° C./min, maintain the temperature unchanged for 10 min, feed $C_2H_2$ gas into the tube furnace at a speed of 1 sccm, and meanwhile, maintain the intensity of pressure at 1.2 Pa by using a vacuum pump, allow to grow for 60 min, and when the growth is finished, cut off the supply of the $C_2H_2$ gas, feed Ar as a protective gas into the tube furnace, and allow to cool down naturally.

Figure 10:
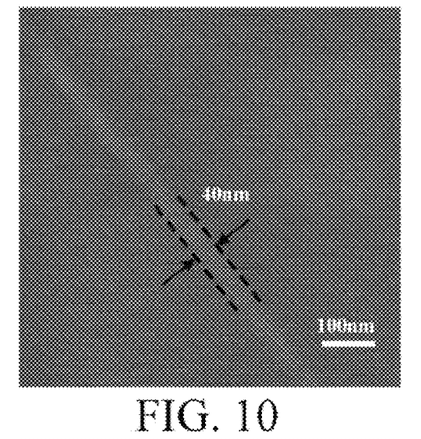
FIG. 10 is an atomic force microscope topological phase image of a graphene nanoribbon in Embodiment 6.
Figure 11:
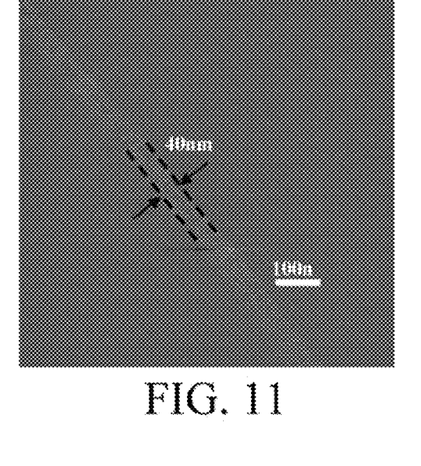
FIG. 11 is an atomic force microscope friction phase image of a graphene nanoribbon in Embodiment 6.

With the above technology, a graphene nanoribbon having a width of 40 nm is grown. FIGS. 10 and 11 are respectively an atomic force microscope topological image and an atomic force microscope friction image, which show that the width of the nanoribbon is 40 nm, and the thickness of the graphene is one layer.

Embodiment 7

Preparation of a Graphene Nanoribbon Having a Width of 100 nm Using Strontium Titanate as a Substrate Step 1: Use strontium titanate as a substrate, and prepare steps of the thickness of a single atomic layer by using a chemical directional etching method.

Step 2: Load the prepared strontium titanate substrate into a PLD growth chamber, use a graphite target as a growth carbon source, and maintain a pressure at $10^{-4}$ Pa, a laser frequency at 10 HZ, and a substrate temperature at 800° C. Allow to grow for 50 pulses.

With the above technology, a graphene nanoribbon having a width of 100 nm is grown.

Embodiment 8

Preparation of a Graphene Nanoribbon Having a Width of 50 nm Using Aluminum Oxide as a Substrate Step 1: Use surface-polished aluminum oxide as a substrate, and prepare steps of the thickness of a single atomic layer by using a bevel etching method.

Step 2: Put the etched aluminum oxide substrate into a PECVD growth tube furnace. In an Ar atmosphere, heat the temperature up to 900° C. at a rate of 10° C./min, maintain the temperature unchanged for 10 min, feed a $C_2H_2/H_2$ gas mixture (a volume ratio thereof is 1:1) into the tube furnace at a speed of 5 sccm, and meanwhile, maintain the intensity of pressure at 100 Pa by using a vacuum pump, allow to grow for 60 min, and when the growth is finished, cut off the supply of the $C_2H_2$ gas, feed Ar as a protective gas into the tube furnace, and allow to cool down naturally.

With the above technology, a graphene nanoribbon having a width of 40 nm is grown.

What is claimed is:

1. A method for preparing a graphene nanoribbon on an insulating substrate, comprising:
   1) preparing a single atomic layer step on an insulating substrate, wherein the insulating substrate is a substrate material which is dissociated to form a cleavage plane with atomic level flatness; and
   2) directly growing a graphene nanoribbon on the insulating substrate having single atomic layer steps, which is obtained in Step 1).

2. The method for preparing a graphene nanoribbon on an insulating substrate as in claim 1, wherein the single atomic layer steps are steps, where the height of a single step is the thickness of one atomic layer; or grooves, the depth of which is the thickness of one atomic layer.

3. The method for preparing a graphene nanoribbon on an insulating substrate as in claim 2, wherein the width of the step is from 50 nm to 20 μm, and the width of the groove is from 1 nm to 500 nm.

4. The method for preparing a graphene nanoribbon on an insulating substrate as in claim 3, wherein the width of the step is from 500 nm to 5 μm.

5. The method for preparing a graphene nanoribbon on an insulating substrate as in claim 1, wherein the insulating substrate is selected from hexagonal boron nitride (hBN), gallium nitride, strontium titanate, aluminum oxide and quartz.

6. The method for preparing a graphene nanoribbon on an insulating substrate as in claim 5, wherein the preparation of the single atomic layer step on the hBN substrate comprises: cleaving a surface of the hBN substrate to obtain a fresh atomic surface; and placing the hBN substrate in a mixture of hydrogen gas and argon gas for an annealing treatment, to obtain an hBN substrate having single atomic layer steps.

7. The method for preparing a graphene nanoribbon on an insulating substrate as in claim 6, wherein in the mixture of the hydrogen gas and the argon gas, a volume ratio of the hydrogen gas and the argon gas is from 1:1 to 1:10.

8. The method for preparing a graphene nanoribbon on an insulating substrate as in claim 7, wherein an annealing temperature of the high temperature annealing treatment is from 1,000° C. to 1,200° C., and an annealing time is from 10 min to 300 min.

9. The method for preparing a graphene nanoribbon on an insulating substrate as in claims 1, wherein in Step 2), the graphene nanoribbon is grown in a step-flow mode on the insulating substrate having single atomic layer steps by using methods of low-pressure chemical vapor deposition (LPCVD), plasma-enhanced chemical vapor deposition (PECVD) or pulsed laser deposition (PLD).

10. The method for preparing a graphene nanoribbon on an insulating substrate as in claim 9, wherein in Step 2), a carbon source required for the growth of the graphene nanoribbon is selected from a gaseous carbon source, a liquid carbon source and a solid carbon source; the gaseous carbon source is selected from methane, ethylene and ethyne; the liquid carbon source is benzene; and the solid carbon source is selected from polymethylmethacrylate (PMMA), glucose, and graphite.

11. The method for preparing a graphene nanoribbon on an insulating substrate as in claim 9, wherein in Step 2), a growth temperature for the graphene nanoribbon is from 500° C. to 1,300° C., and a growth time is from 5 min to 5 h.

* * * * *